United States Patent
Herring et al.

(10) Patent No.: US 7,401,380 B2
(45) Date of Patent: Jul. 22, 2008

(54) LOW OVERHEAD HINGE ASSEMBLY

(75) Inventors: Dean Frederick Herring, Youngsville, NC (US); Daniel Paul Kelaher, Holly Springs, NC (US); Glenn Edward Myrto, Holly Springs, NC (US); Paul Andrew Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 291 days.

(21) Appl. No.: 11/242,584

(22) Filed: Sep. 30, 2005

(65) Prior Publication Data

US 2007/0074373 A1    Apr. 5, 2007

(51) Int. Cl.
    *E05D 1/06* (2006.01)
(52) U.S. Cl. .............. 16/268; 16/257; 16/260
(58) Field of Classification Search .......... 16/247, 16/224, 259–265, 268, 386, 388, 365, 257
    See application file for complete search history.

(56) References Cited

U.S. PATENT DOCUMENTS

| | | | | |
|---|---|---|---|---|
| 2,808,611 | A | * | 10/1957 | Bauermeister ............... 16/258 |
| 5,127,132 | A | * | 7/1992 | Karlin ........................ 16/261 |
| 5,539,956 | A | * | 7/1996 | Wallace ...................... 16/261 |
| 5,940,934 | A | * | 8/1999 | Turner ........................ 16/257 |
| 6,070,293 | A | * | 6/2000 | Schreiber .................... 16/229 |
| 6,151,757 | A | * | 11/2000 | Beals et al. ................... 16/380 |
| 6,181,552 | B1 | | 1/2001 | Neville, Jr. et al. |
| 6,788,542 | B2 | | 9/2004 | Rumney |
| 6,805,248 | B2 | | 10/2004 | Champion et al. |
| 2003/0161113 | A1 | | 8/2003 | Wrycraft et al. |

FOREIGN PATENT DOCUMENTS

DE    02806284 A1    8/1979

OTHER PUBLICATIONS

"Hinged Operator Panel", IBM Technical Disclosure Bulletin, Aug. 1990, vol. 33, No. 3B, pp. 69-70.

* cited by examiner

*Primary Examiner*—Chuck Y. Mah
(74) *Attorney, Agent, or Firm*—Harrington & Smith, PC

(57) ABSTRACT

A low overhead hinge assembly comprising a stationary hinge plate and a rotating hinge plate. The stationary hinge plate having a stationary hinge plate body portion and a plurality of stationary hinge plate digits coupled to the stationary hinge plate body portion, each of the stationary hinge plate digits having an opening therein. The rotating hinge plate having a rotating hinge plate body portion and a plurality of pins coupled to the rotating hinge plate body portion, wherein the stationary hinge plate digits are configured to be engaged with the rotating hinge plate pins so that each of a plurality of the rotating hinge plate pins is inserted into an opening in one of the stationary hinge plate digits so as to pivotally couple the rotating hinge plate to the stationary hinge plate.

16 Claims, 4 Drawing Sheets

LOW OVERHEAD HINGE ASSEMBLY

BACKGROUND OF THE INVENTION

1. Field of the Invention.

The present invention relates to a hinge assembly for use in space constrained applications, such as cable arms in electrical equipment racks.

2. Description of Related Art.

To remove a conventional swinging door or rotating arm, typically a hinge pin is removed by pulling it out vertically and the door or arm can then be removed from the stationary mounted section of the hinge assembly. However, if a hinge has to be placed in an application with insufficient overhead above the hinge, it may not be possible to remove the hinge pin without increasing the overhead space. For example, when thin, rack-optimized computer systems with cable management arms are removed from a rack, the cable management arm often has to be disconnected from the rack. These arms are often impossible to install or remove when another system is installed directly above the one being serviced because the hinge pin can not be inserted or removed due to the limited height available for the hinge pin.

It can be seen that there is a need to provide an improved hinge assembly for space constrained applications.

SUMMARY OF THE INVENTION

To overcome the limitations in the prior art described above, and to overcome other limitations that will become apparent upon reading and understanding the present specification, the present invention provides a low overhead hinge assembly comprising a stationary hinge plate and a rotating hinge plate. The stationary hinge plate having a stationary hinge plate body portion and a plurality of stationary hinge plate digits coupled to the stationary hinge plate body portion, each of the stationary hinge plate digits having an opening therein. The rotating hinge plate having a rotating hinge plate body portion and a plurality of pins coupled to the rotating hinge plate body portion, wherein the stationary hinge plate digits are configured to be engaged with the rotating hinge plate pins so that each of a plurality of the rotating hinge plate pins is inserted into an opening in one of the stationary hinge plate digits so as to pivotally couple the rotating hinge plate to the stationary hinge plate.

In a further embodiment the low overhead hinge assembly includes a shim having a shim body portion and a plurality of shim digits, wherein the shim is coupled to the rotating hinge plate and wherein each shim digit is configured to be inserted between one of the stationary hinge plate digits and an adjacent rotating hinge plate pin when the stationary hinge plate digits and rotating hinge plate pins are engaged.

In a further embodiment the stationary hinge plate digits have a notch in a side wall of the digits so as to allow the rotating hinge plate pins to be inserted into the cavity of the stationary hinge plate digits using a motion in a direction substantially perpendicular to an edge of the rotating hinge plate on which the rotating hinge plate pins are coupled.

These and various other advantages and features of novelty which characterize the invention are pointed out with particularity in the claims annexed hereto and form a part hereof. However, for a better understanding of the invention and its advantages, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description of preferred embodiments of the present invention, reference is made to the accompanying drawings, which form a part hereof, and in which is shown by way of illustration specific embodiments in which the invention may be practiced. It is to be understood that other embodiments may be utilized as structural changes may be made without departing from the scope of the present invention.

The present invention provides a hinge assembly for space constrained applications. The present invention allows the hinge assembly to be disassembled with very little or no overhead above the hinge.

Figure 1A:
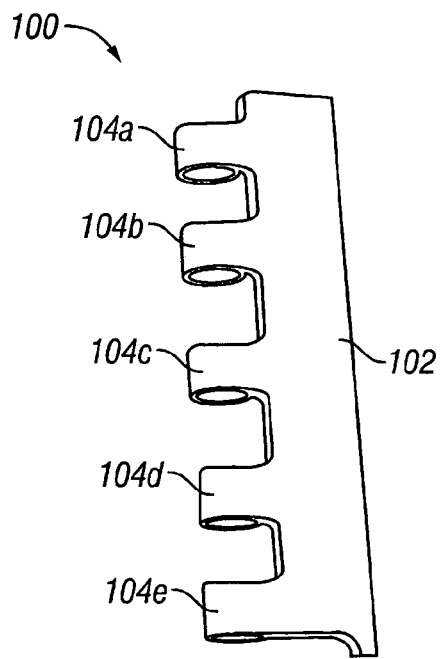
FIG. 1A illustrates a stationary hinge plate for a hinge assembly according to an embodiment of the present invention.
Figure 1B:
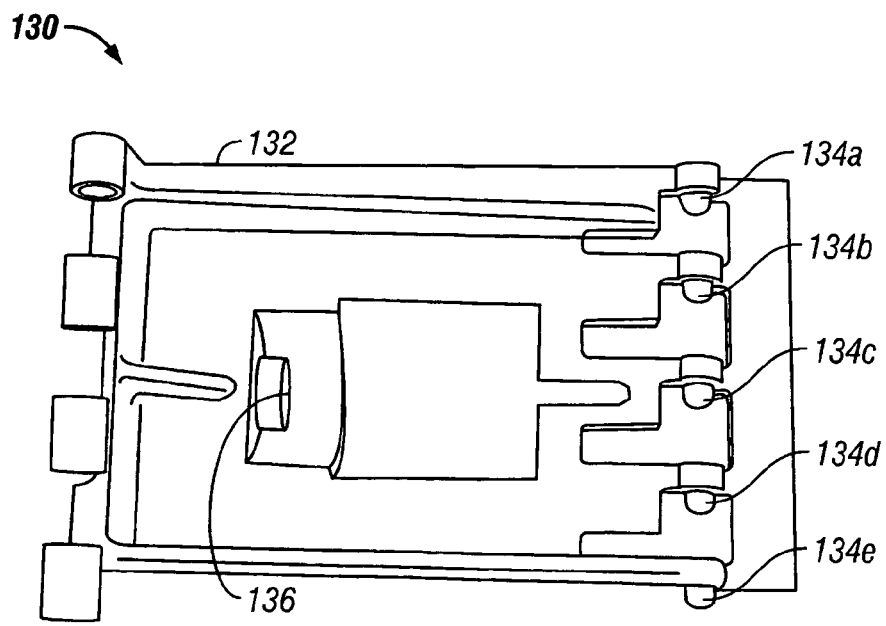
FIG. 1B illustrates a rotating hinge plate for a hinge assembly according to an embodiment of the present invention.

FIG. 1A illustrates a stationary hinge plate 100 for a hinge assembly according to an embodiment of the present invention. Stationary hinge plate 100 is comprised of a body portion 102 and five protruding digits 104a-104e. Stationary hinge plate digits 104a-104e are each comprised of a hollow cylinder coupled to a member extending from body portion 102. Stationary hinge plate digits 104a-104e may either have a cylindrical hole through the entire digit or a cavity that only extends part of the length of the digit such that each digit has a solid bottom. FIG. 1B illustrates a rotating hinge plate 130 for a hinge assembly according to an embodiment of the present invention. Rotating hinge plate 130 is comprised of a body portion 132 and hinge pins 134a-134e. Hinge pins 134a-134e are relatively short to allow the pins to be removed from the stationary hinge plate hollow cylindrical digits with a small upward movement. Rotating hinge plate 130 further includes a spring mounting element 136.

Figure 1C:
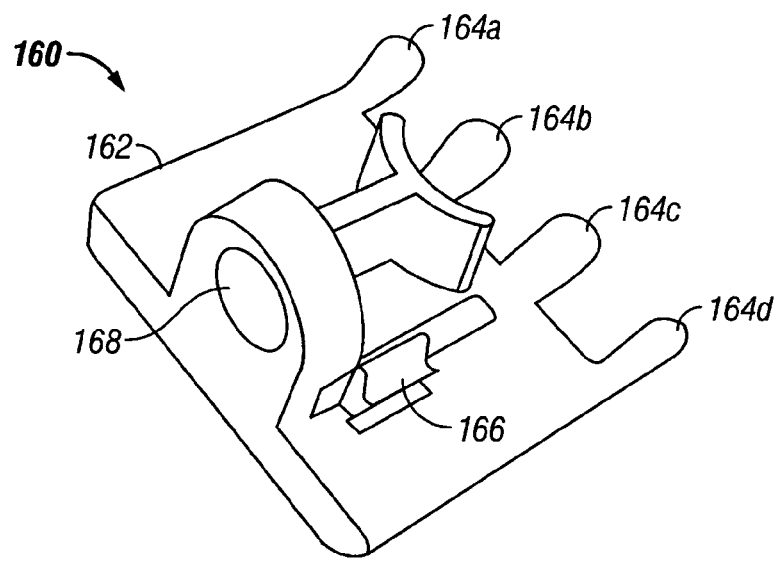
FIG. 1C illustrates a shim plate for a hinge assembly according to an embodiment of the present invention.

FIG. 1C illustrates a shim plate 160 for a hinge assembly according to an embodiment of the present invention. Shim plate 160 is comprised of four disc shaped digits 164a-164d which extend from body portion 162. Shim plate 160 further includes a clip 166 for attaching the shim plate to the rotating hinge plate 130, as well as a spring mounting element 168. Shim plate 160 provides additional stability and strength for the hinge assembly. Shim plate 160 slides horizontally along the rotating hinge plate to act as a wedge between the rotating and stationary sections of the hinge. Shim plate 160 is spring-loaded and can also be latched for extra security.

Figure 2:
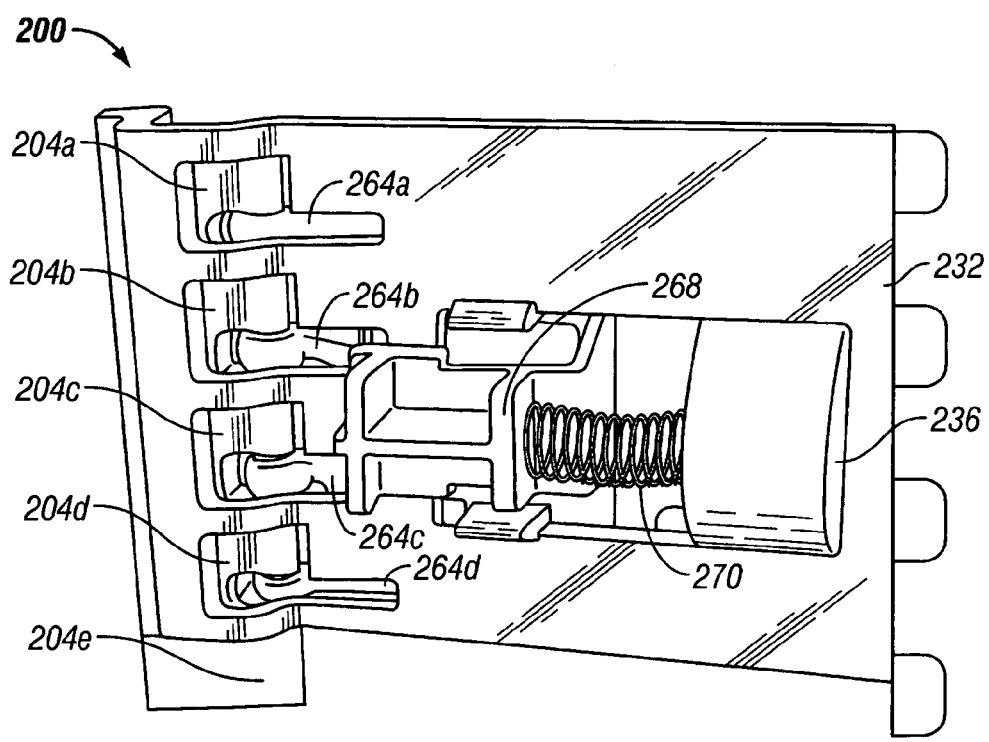
FIG. 2 illustrates a hinge assembly according to an embodiment of the present invention.

FIG. 2 illustrates a hinge assembly 200 according to an embodiment of the present invention. This hinge assembly is comprised of stationary hinge plate 100, rotating hinge plate 130 and shim plate 160 (shown in FIGS. 1A-1C). More specifically, FIG. 2 shows stationary hinge plate hollow cylindrical digits 204a-204e and shim plate digits 264a-264d engaged with the rotating plate hinge pins. A rotating plate spring mounting bracket 236 is coupled to the rotating plate body portion 232. FIG. 2 further comprises a shim spring 270 mounted between the shim spring mounting bracket 268 and the rotating plate spring mounting bracket 236. Shim spring 270 keeps the shim plate digits 264a-264d engaged with hinge plate hollow cylindrical digits 204a-204e and the rotating plate hinge pins.

To connect the components of the hinge assembly, first the shim plate and rotating hinge plate are coupled together using clip 166, shown in FIG. 1C. Next shim plate 160 is slid backwards relative to stationary hinge plate 100 to allow access to stationary hinge plate hollow cylindrical digits 204a-204e. Rotating hinge plate 232 is then lifted slightly above stationary hinge plate 100, then slid horizontally and lowered such that rotating hinge plate pins 134a-134e (FIG. 1B) are inserted into stationary hinge plate hollow cylindrical digits 204a-204e. When rotating hinge plate pins 134a-134e are engaged into the hollow cylindrical digits on the stationary hinge plate, then the shim plate is slid forward to close the hinge. Spring 270 keeps the components engaged or an optional latch can also be used to lock the hinge assembly together. The assembly is then complete and functional. In normal operation, connection and disconnection of the hinge assembly does not require the shim plate and the rotating hinge plate to be separated from each other, it just requires sliding of the shim plate relative to the rotating hinge plate.

To disconnect the hinge assembly the shim plate is slid backwards to open the hinge. If there are any latches keeping the shim plate in place, they are unlatched to allow the shim plate to be slid back. Once the shim plate is slid out of place, the rotating hinge plate can be removed from the stationary hinge plate of the hinge by lifting it slightly, pulling it horizontally to clear the hinge pins, and the hinge plate components are then separated.

This embodiment of the present invention provides a hinge assembly that requires very little overhead clearance to install or remove the stationary hinge plate or cable management arm from the rotating hinge plate. The shim plate provides additional strength to the overall hinge assembly. The present invention can generally be used with any type of rotating arm, cover or door and is particularly useful for applications where the area above the stationary hinge is limited such that there is not sufficient space to remove a conventional hinge pin.

Figure 3:
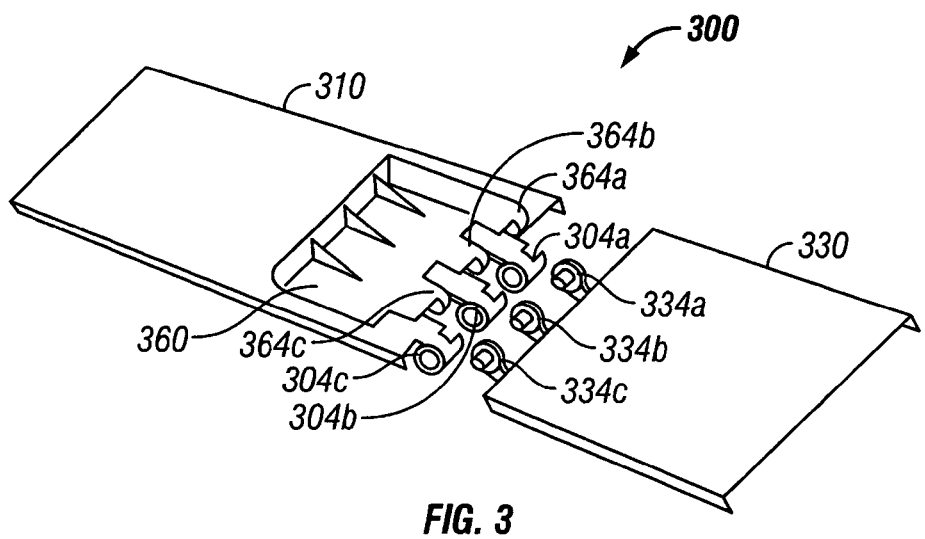
FIG. 3 illustrates the components of a no overhead hinge assembly according to an embodiment of the present invention.

FIG. 3 illustrates the components of a no overhead hinge assembly 300 according to an embodiment of the present invention. Stationary hinge plate 310 is comprised of a body portion and three protruding digits 304a-304c. Stationary hinge plate digits 304a-304c are each comprised of a hollow cylinder with a notch. Rotating hinge plate 330 is comprised of a body portion and three hinge pins 334a-334c. Hinge pins 334a-334c are relatively short to allow the pins to be inserted into the notches in the stationary hinge plate digits 304a-304c. Shim plate 360 is comprised of a body portion and three disc shaped digits 364a-364c with a side wall extending down from the top surface of each disc around part of the circumference of the disc. Shim plate 360 provides additional stability and strength for the hinge assembly. The shim plate slides horizontally along the stationary hinge plate to act as a wedge between the rotating and stationary sections of the hinge. The sidewalls on the shim plate digits 364a-364c prevent the rotating plate hinge pins 334a-334c from being disengaged from the stationary hinge plate notched digits 304a-304c. This shim plate can be spring-loaded and or latched for extra security.

Figure 4:
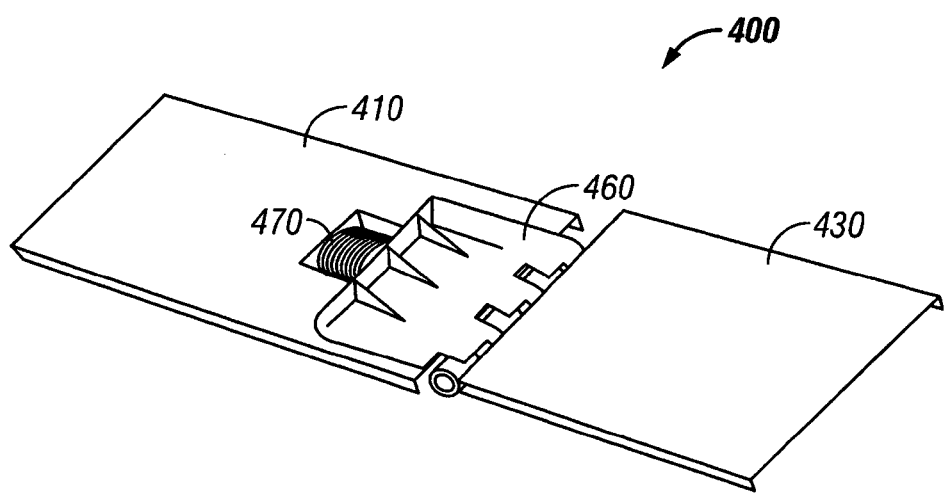
FIG. 4 illustrates a no overhead hinge assembly according to an embodiment of the present invention.

FIG. 4 illustrates a no overhead hinge assembly 400 according to an embodiment of the present invention. In FIG. 4 the stationary hinge plate notched hollow cylindrical digits and shim plate digits are engaged with the rotating plate hinge pins. No overhead hinge assembly 400 further comprises a shim spring 470 mounted between the shim 460 and rotating hinge plate 410. Shim spring 470 keeps the shim plate digits 364a-364c engaged with hinge plate notched hollow cylindrical digits 304a-304c and rotating plate hinge pins 334a-334c.

To connect the hinge assembly components shown in FIG. 3, shim plate 360 (FIG. 3) is slid back relative to the rotating hinge plate such that stationary hinge plate digits 304a-304c are exposed. Rotating hinge plate 330 is then slid substantially horizontally into the stationary hinge plate such that the hinge pins slide through the stationary hinge plate digit notches to sit in the hollow cylindrical area of the stationary hinge plate digits. When the rotating hinge plate pins are engaged into the stationary hinge plate notched cylindrical digits, then the shim plate digits with side walls are slid forward to close the hinge. The shim digit side walls prevent the rotating hinge plate digits from slipping out of the stationary hinge plate notched cylindrical digits. Spring 470 keeps the components engaged or an optional latch can also be used to lock the hinge assembly together. The hinge assembly is then complete and ready for operation.

To disconnect the hinge assembly 400, if there are any latches keeping the shim plate in place, they are unlatched to allow the shim plate to be slid away. Shim plate 460 is then slid backwards to open the hinge. Once the shim plate is slid out of place, the notches in the stationary hinge plate digits are now accessible. Rotating hinge plate 430 can then be removed from stationary hinge plate 410 by moving it horizontally away from the stationary hinge plate.

Figure 5:
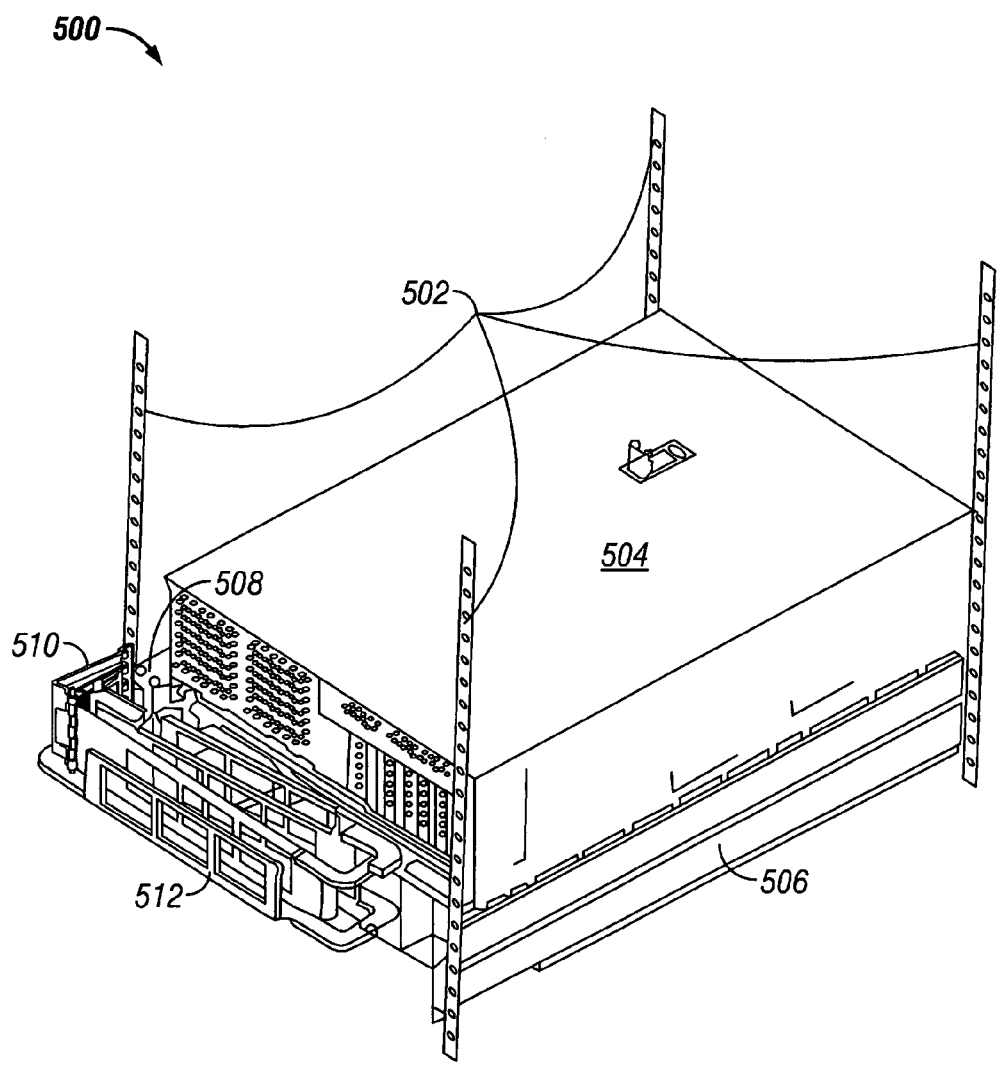
FIG. 5 illustrates a perspective view of a computer equipment rack assembly including a cable arm assembly according to an embodiment of the present invention.

FIG. 5 illustrates a perspective view of a computer equipment rack assembly 500 including a cable arm assembly according to an embodiment of the present invention. Equipment rack 502 provides a housing for a plurality of individual equipment units 504, which may be a file server, storage server, or other computing device. Each equipment unit 504 is slidably mounted in rack 502 using drawer slides 506. Cable arm 512 is coupled to a low overhead hinge assembly 510 which in turn is coupled to rack 502 via stationary hinge plate 508. Low overhead hinge assembly 510 allows the rotating hinge plate to be removed from the stationary hinge plate, thereby disconnecting the cable arm without requiring removal of a hinge assembly—cable arm above or below this cable arm.

While the present invention has been described in terms of preferred embodiments for achieving this invention's objectives, it will be appreciated by those skilled in the art that variations may be accomplished in view of these teachings without deviating from the spirit or scope of the present invention.

What is claimed is:
1. A hinge assembly comprising:
   a first hinge plate having a first hinge plate body portion and a plurality of first hinge plate digits coupled to the first hinge plate body portion, each of the first hinge plate digits having an opening therein;
   a second hinge plate having a second hinge plate body portion and a plurality of pins coupled to the second hinge plate body portion, wherein the first hinge plate digits are configured to be engaged with the second hinge plate pins so that each of a plurality of the second hinge plate pins is inserted into one of the openings in one of the first hinge plate digits so as to pivotally couple the second hinge plate to the first hinge plate;

a shim having a shim body portion and a plurality of shim digits, wherein the shim is coupled to the second hinge plate and wherein each shim digit is configured to be inserted between one of the first hinge plate digits and an adjacent second hinge plate pin when the first hinge plate digits and second hinge plate pins are engaged; and a spring between the shim and the second hinge plate, wherein the spring biases the shim relative to the second hinge plate to locate the shim digits in a substantially aligned position relative to the second hinge plate pins.

2. The hinge assembly of claim 1 further comprising a clip to keep the shim digits substantially aligned with the second hinge plate pins.

3. The hinge assembly of claim 1 wherein the openings in the first hinge plate digits each comprise a cylindrical hole.

4. The hinge assembly of claim 1 wherein the openings in the first hinge plate digits each comprise a cylindrical cavity.

5. The hinge assembly of claim 4 wherein the first hinge plate notches in a side wall of the first hinge plate between the digits so as to allow the second hinge plate pins to be inserted into the cavities of the first hinge plate digits using a motion in a direction substantially perpendicular to an edge of the second hinge plate on which the second hinge plate pins are coupled.

6. The hinge assembly of claim 1 wherein each shim digit comprises a rounded section and a partial side wall substantially perpendicular to the rounded section configured to keep the first hinge plate digits engaged with the second hinge plate pins when the second hinge plate is pivotally coupled to the first hinge plate.

7. The hinge assembly of claim 1 wherein each shim digit comprises a rounded section, wherein the openings in the first hinge plate digits each comprise a cylindrical hole, and wherein the rounded sections at least partially align in the cylindrical holes at second ends of the holes opposite from first ends of the holes having the pins.

8. The hinge assembly of claim 7 wherein the shim is longitudinally slidable mounted on the second hinge plate.

9. The hinge assembly of claim 8 wherein the second hinge plate comprises a first spring mounting element, wherein the slim comprises a second spring mounting element, and wherein the spring is compressed between the first and second spring mounting elements.

10. The hinge assembly of claim 8 wherein the shim comprises two clips which clip the shim on the second hinge plate such that the shim can slide on the second hinge plate.

11. The hinge assembly of claim 10 wherein the spring exerts a biasing force between the shim and the second hinge plate which is in a direction orthogonal to a direction of the pins.

12. The hinge assembly of claim 1 wherein the shim is longitudinally slidable mounted in a hole of the second hinge plate.

13. The hinge assembly of claim 1 wherein the second hinge plate comprises a first spring mounting element, wherein the slim comprises a second spring mounting element, and wherein the spring is compressed between the first and second spring mounting elements.

14. The hinge assembly of claim 1 wherein the shim comprises two clips which clip the shim on the second hinge plate such that the shim can slide on the second hinge plate.

15. The hinge assembly of claim 1 wherein the spring exerts a biasing force between the shim and the second hinge plate which is in a direction orthogonal to a direction of the pins extending into the openings.

16. A hinge assembly comprising:

a first hinge plate having a first hinge plate body portion and a plurality of first hinge plate digits coupled to the first hinge plate body portion, each of the first hinge plate digits having an opening therein;

a second hinge plate having a second hinge plate body portion and a plurality of pins coupled to the second hinge plate body portion, wherein the second hinge plate pins are located in respective ones of the openings of the first hinge plate digits to thereby pivotally couple the second hinge plate to the first hinge plate;

a shim having a shim body portion and a plurality of shim digits, wherein each shim digit is inserted between one of the first hinge plate digits and an adjacent second hinge plate pin, wherein the shim is longitudinally slidable mounted in a hole in the second hinge plate, and wherein the shim comprises clips which clip the shim on the second hinge plate such that the shim can slide on the second hinge plate; and a spring between the shim and the second hinge plate, wherein the spring biases the shim relative to the second hinge plate to locate the shim digits in a substantially aligned position relative to the second hinge plate pins, wherein the second hinge plate comprises a first spring mounting element, wherein the slim comprises a second spring mounting element, wherein the spring is compressed between the first and second spring mounting elements, and wherein the spring exerts a biasing force between the shim and the second hinge plate which is in a direction orthogonal to a direction of the pins into the openings.

* * * * *